US011887639B2

(12) United States Patent
Northrup et al.

(10) Patent No.: US 11,887,639 B2
(45) Date of Patent: Jan. 30, 2024

(54) OPTICAL IDENTIFIER AND SYSTEM FOR READING SAME

(71) Applicant: Neursciences LLC, Bedford, NH (US)

(72) Inventors: Charles Northrup, Bedford, NH (US); Jefferson Odhner, Amherst, NH (US); Richard Rarey, Kensington, MD (US)

(73) Assignee: Neursciences LLC, Bedford, NH (US)

( * ) Notice: Subject to any disclaimer, the term of this patent is extended or adjusted under 35 U.S.C. 154(b) by 0 days.

(21) Appl. No.: 17/592,792

(22) Filed: Feb. 4, 2022

(65) Prior Publication Data

US 2022/0157339 A1    May 19, 2022

Related U.S. Application Data

(63) Continuation of application No. 16/287,936, filed on Feb. 27, 2019, now Pat. No. 11,244,705.
(Continued)

(51) Int. Cl.
*G11B 7/0065*    (2006.01)
*G11B 7/1353*    (2012.01)
(Continued)

(52) U.S. Cl.
CPC ......... *G11B 7/1353* (2013.01); *G03H 1/0248* (2013.01); *G03H 1/2645* (2013.01);
(Continued)

(58) Field of Classification Search
CPC ........... G11B 5/00; G11B 5/09; G11B 7/0065; G11B 2007/00653; G11B 2220/2504;
(Continued)

(56) References Cited

U.S. PATENT DOCUMENTS 5,896,210 A    4/1999   Redfield et al.
6,040,930 A    3/2000   Heanue et al.
(Continued)

FOREIGN PATENT DOCUMENTS

EP    2738624       6/2014
TW    201736871    1/2021
WO    2016167173   10/2016

OTHER PUBLICATIONS

International Search Report for PCT/US19/19893 dated May 13, 2019.
(Continued)

*Primary Examiner* — Nabil Z Hindi
(74) *Attorney, Agent, or Firm* — Sheehan Phinney Bass & Green PA

(57) ABSTRACT

A system includes a plurality of optical identifiers and a reader for the optical identifiers. Each optical identifier has an optical substrate and a volume hologram (e.g., with unique data, such as a code page) in the optical substrate. The reader for the optical identifiers includes an illumination source (e.g., a laser), and a camera. The illumination source is configured to direct light into a selected one of the optical identifiers that has been placed into the reader to produce an image of the associated volume holograms at the camera. The camera is configured to capture the image. The captured image may be stored in a digital format by the system.

27 Claims, 13 Drawing Sheets

Related U.S. Application Data

(60) Provisional application No. 62/636,232, filed on Feb. 28, 2018.

(51) Int. Cl.
*G03H 1/26* (2006.01)
*G03H 1/02* (2006.01)
*G11C 13/04* (2006.01)
*G11B 7/1362* (2012.01)
*G11B 7/125* (2012.01)
*G11B 7/127* (2012.01)
*G03H 1/22* (2006.01)
*G03H 1/00* (2006.01)

(52) U.S. Cl.
CPC .............. *G11B 7/125* (2013.01); *G11B 7/127* (2013.01); *G11B 7/1362* (2013.01); *G11C 13/042* (2013.01); *G03H 1/0011* (2013.01); *G03H 2001/2244* (2013.01); *G03H 2001/2675* (2013.01)

(58) Field of Classification Search
CPC .. G03H 1/0011; G03H 1/2205; G03H 1/0248; G03H 1/2234; G03H 222/34; G03H 2001/2244; G03H 223/24; G03G 1/2202

USPC ................................................. 360/100, 103
See application file for complete search history.

(56) References Cited

U.S. PATENT DOCUMENTS

| | | | |
|---|---|---|---|
| 7,995,443 | B2 | 8/2011 | Bates et al. |
| 10,915,066 | B2 | 2/2021 | Rewitz |
| 2002/0071594 | A1 | 6/2002 | Kool |
| 2005/0119786 | A1 | 6/2005 | Kadaba |
| 2006/0198275 | A1* | 9/2006 | Kogure ................ G11B 7/0065 |
| 2006/0250925 | A1* | 11/2006 | Teraoka ................ G03H 1/265 |
| 2009/0080314 | A1 | 3/2009 | Matsumoto |
| 2009/0153926 | A1 | 6/2009 | Wiltshire |
| 2009/0244518 | A1 | 10/2009 | Ophey et al. |
| 2012/0002257 | A1 | 1/2012 | Shirakura et al. |
| 2018/0144160 | A1 | 5/2018 | Shirakura et al. |

OTHER PUBLICATIONS

Kogelnik, Bell System Technical Journal vol. 48, Issue 9, pp. 2909-2947, Nov. 1969.
Extended European Search Report dated Oct. 26, 2021 for Application 19760758.3.
Taiwan Search Report for TW108107010, performed Sep. 5, 2022.

* cited by examiner

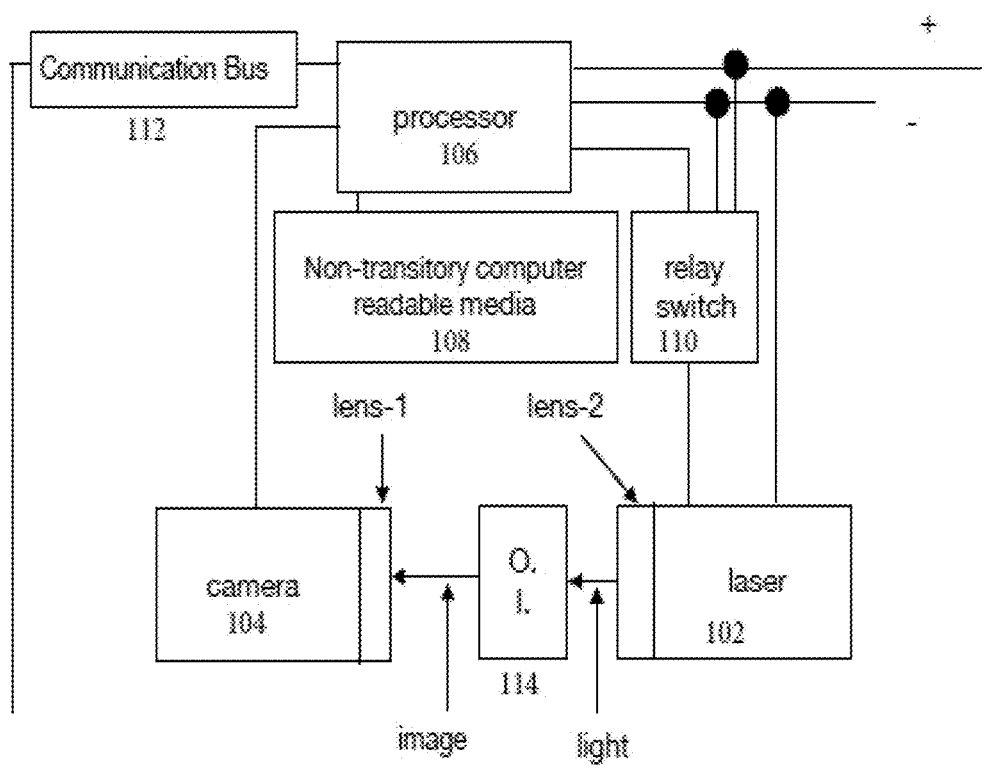
Figure 1. NB-OIS Components.

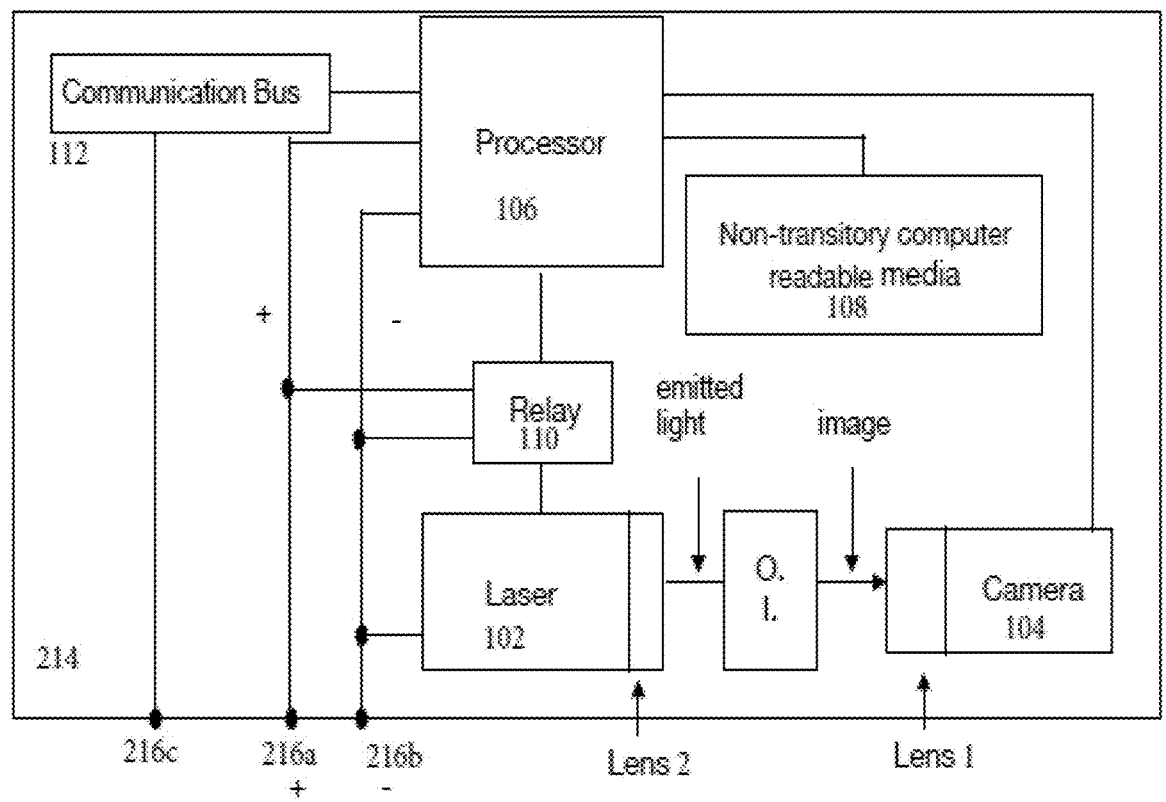
Figure 2. NB-OIS with Solder Points.

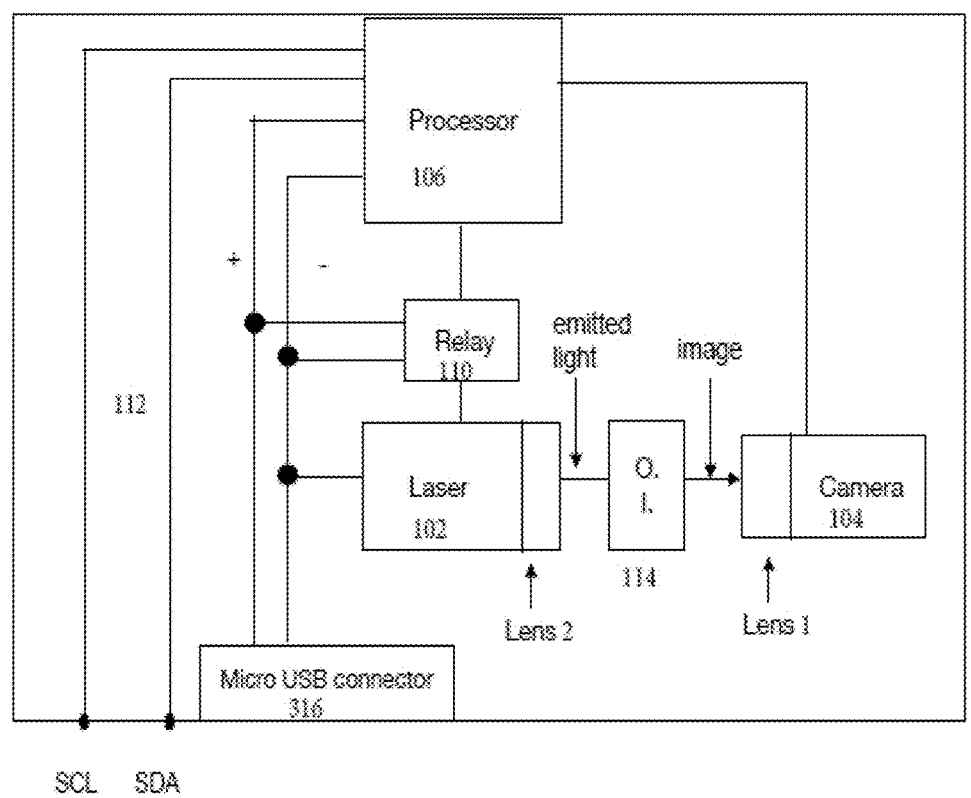
Figure 3. NB-OIS Micro with Micro USB Power.

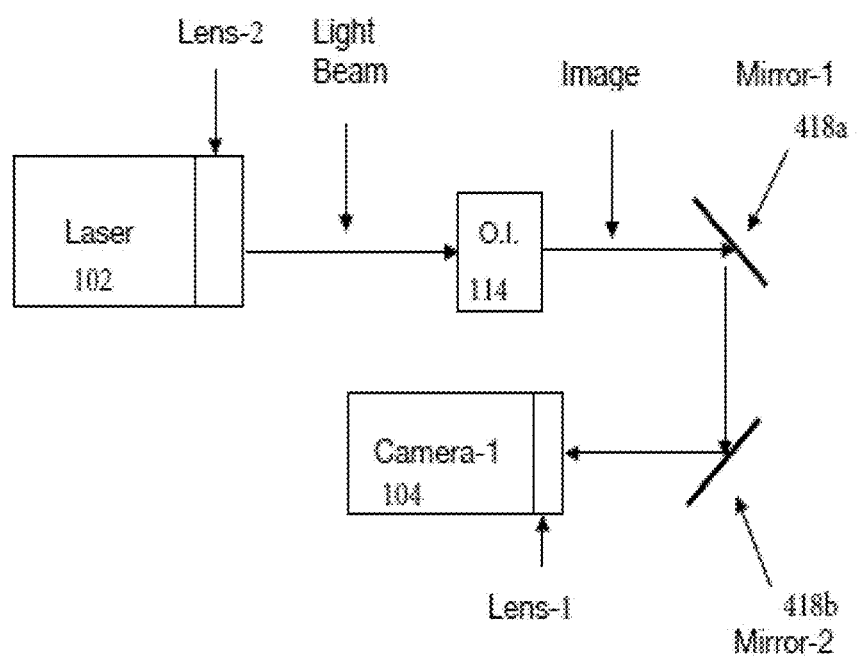
Figure 4. Using Mirrors.

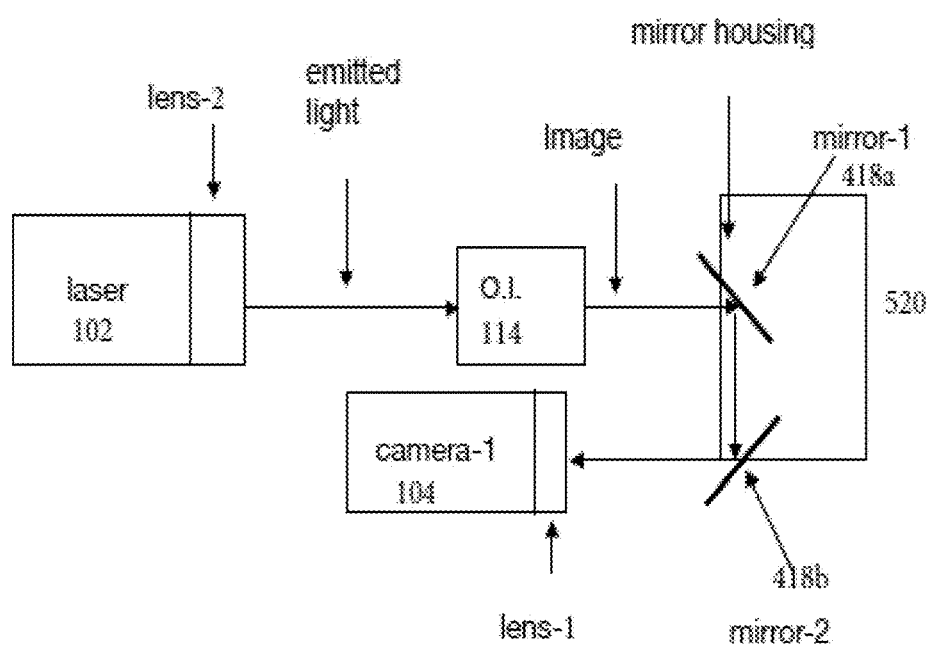
Figure 5. Mirror Housing.

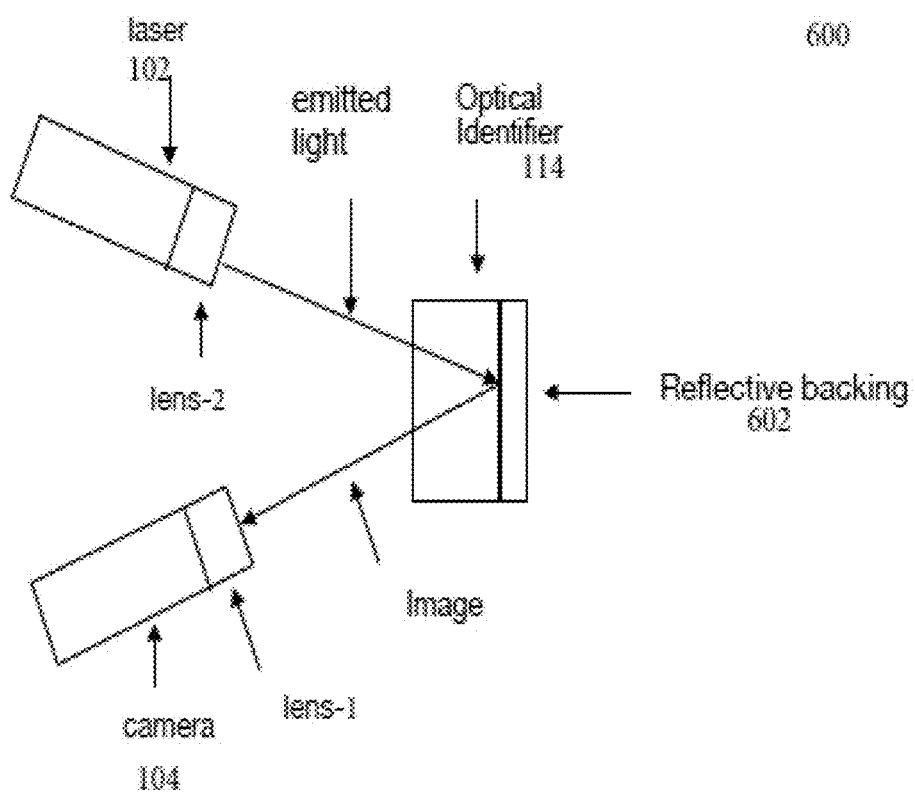

Figure 7.    O.I. Unit.
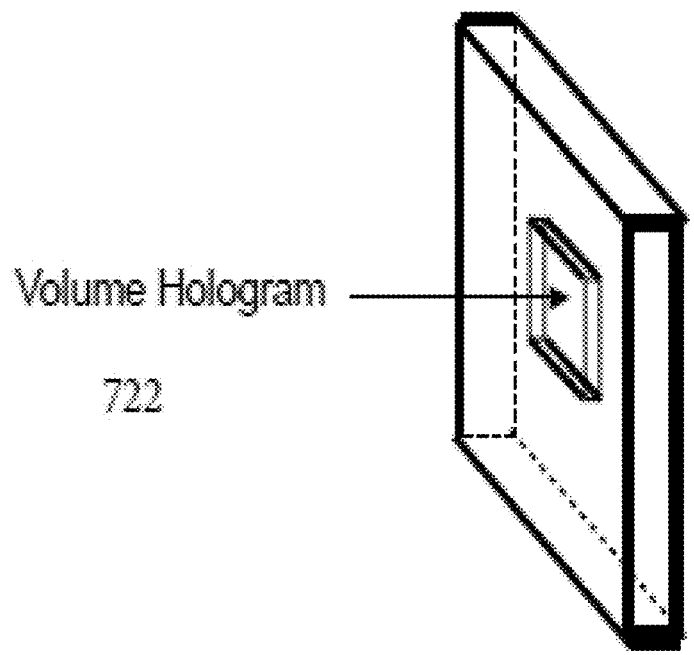
Volume Hologram 722

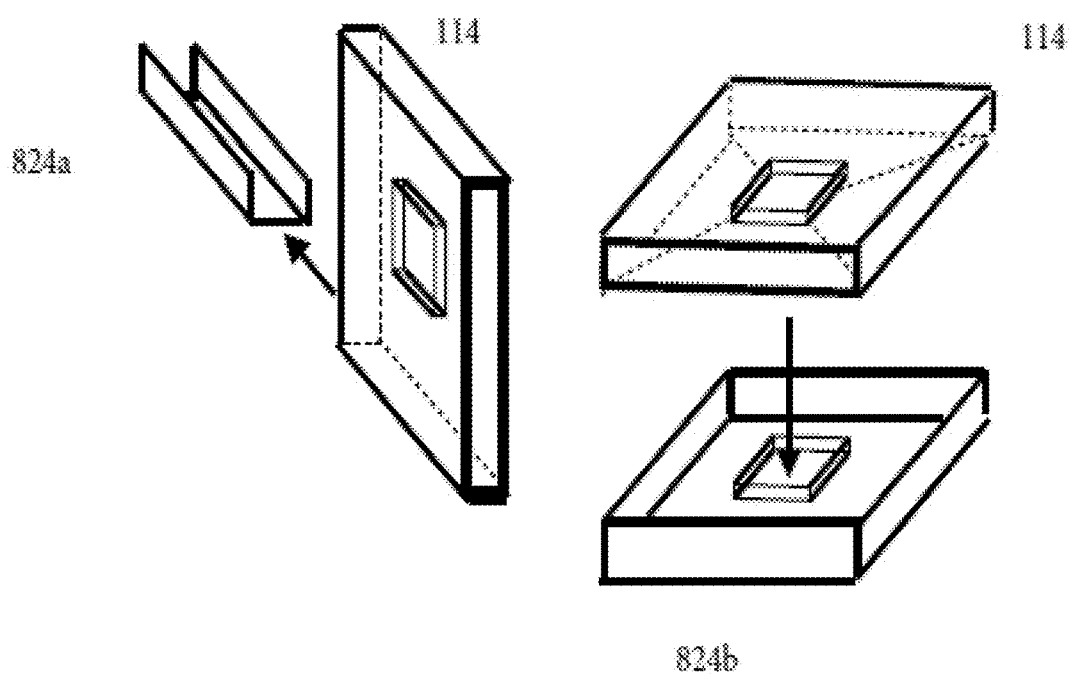
Figure 8. O.I. Holding Apparatus.

Figure 9. Optical Identifier Holding Apparatus.
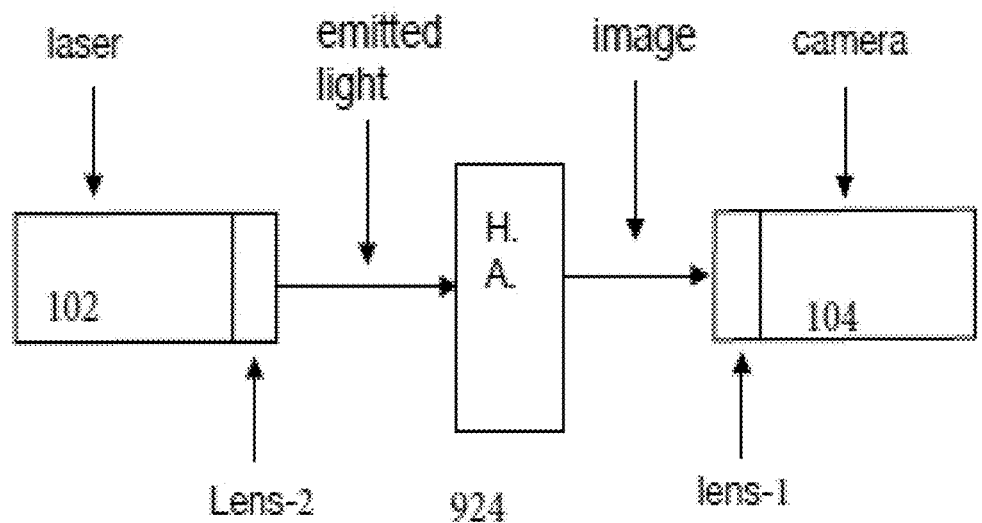

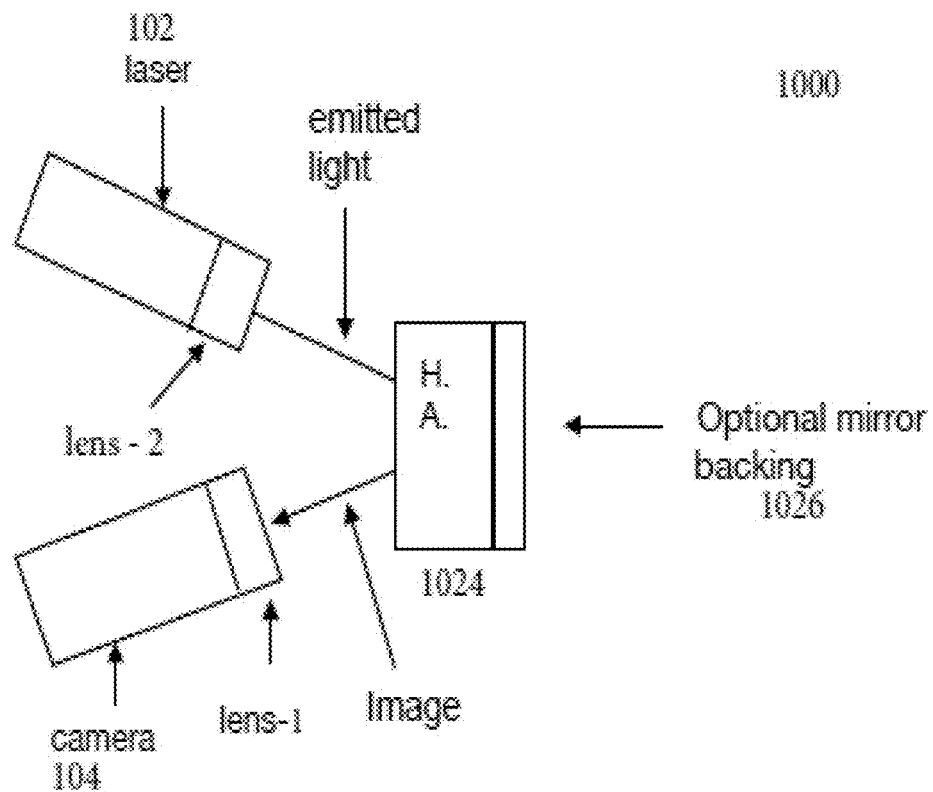
Figure 10. Optical Identifier Reflective Hologram Holding Apparatus.

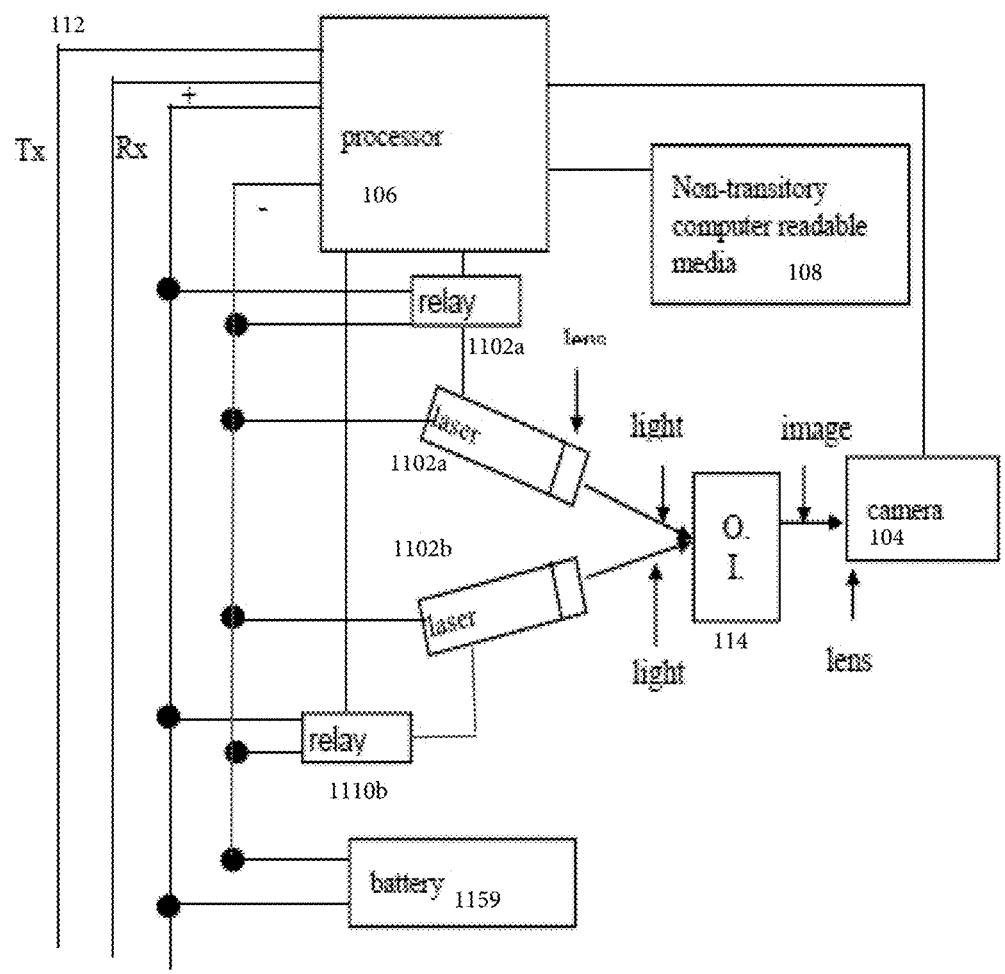

Figure 12A    QR-Code of an RSA Private Key
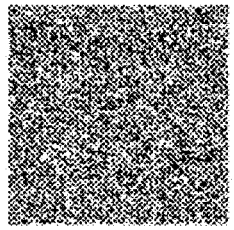
Figure 12B.    QR-Code of Random Data in Hex Format
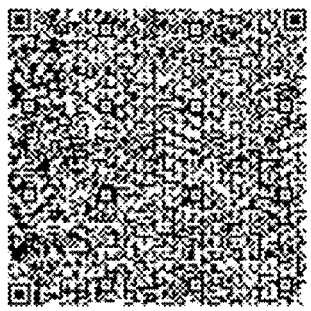
Figure 12C.    QR-Code of Machine Readable Object Code.
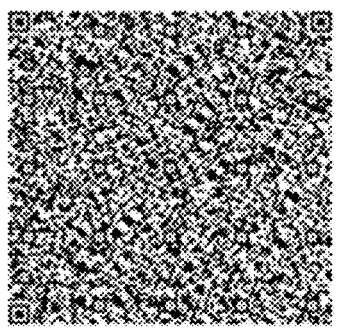

Example of Coherent Light Beam Split into
Object Beam and Reference Beam

OPTICAL IDENTIFIER AND SYSTEM FOR READING SAME

CROSS-REFERENCE TO RELATED APPLICATIONS

This application is a continuation of U.S. patent application Ser. No. 16/287,936, entitled Optical Identifier and System for Reading Same, which was filed on Feb. 27, 2019 and claims the benefit of priority to U.S. Provisional Patent Application No. 62/636,232, entitled Optical Identifier and System for Reading Same, which was filed on Feb. 28, 2018, the disclosures of which applications are incorporated by reference herein in their entirety. The following applications are noteworthy: U.S. Provisional Patent Application Ser. No. 62/636,252, entitled NB Controller and Form Factors, filed Feb. 28, 2018; U.S. Provisional Patent Application Ser. No. 62/396,332, filed Sep. 19, 2016 and entitled Thing Machine; U.S. patent application Ser. No. 15/834,311, filed Dec. 7, 2017 and entitled Thing Machine Systems and Methods; U.S. patent application Ser. No. 15/708,842, filed on Sep. 19, 2017 and entitled Thing Machine; and U.S. Provisional Patent Application Ser. No. 62/626,917, filed Feb. 6, 2018 and entitled Optical Identity System and Methods. The disclosure in each of these applications is incorporated entirely by reference herein.

FIELD OF THE INVENTION

The present disclosure relates to an optical identifier and a system for reading and utilizing the optical identifier and/or information represented in or by the optical identifier.

BACKGROUND OF THE INVENTION

Security is becoming more and more important, particularly as computer systems and networks become more and more complex. There are a variety of ways to secure computer systems and networks and the data stored in and utilized by computer systems and networks.

SUMMARY OF THE INVENTION

In one aspect, a system includes a plurality of optical identifiers and a reader for the optical identifiers. Each optical identifier has an optical substrate and a volume hologram (e.g., with unique data, such as a code page) in the optical substrate. The reader for the optical identifiers includes a laser, and a camera. The laser is configured to direct laser light into a selected one of the optical identifiers that has been placed into the reader to produce an image of the associated volume holograms at the camera. The camera is configured to capture the image. The captured image may be stored in a digital format by the system.

In another aspect, a method includes directing light from a laser into a first optical identifier, where the first optical identifier comprises an optical substrate and a volume hologram in the optical substrate; and capturing an image of the volume hologram produced by the light from the laser with a camera. The captured image may be stored in a digital format, e.g., in a non-transitory, computer-based memory.

In another aspect, a system for reading information from an optical identifier includes one or more lasers, a camera, a processor, and a relay switch. The processor causes the relay switch to turn on, and deliver power to (and thereby turn on) the laser. The laser, once on, illuminates the optical identifier. The illumination provided by the laser creates an image of the volume hologram that the camera captures. The processor, in a typical implementation, triggers the camera to capture the image. The processor may then store the captured image, or some electronic representation of the captured image in a computer-based memory storage device. After the image is captured, the processor may causes or allows the laser to turn off.

In a typical implementation, the optical identifier is a solid piece of material (e.g., glass or the like) with a volume hologram incorporated into the solid piece of material. The volume hologram may include a code page of data (e.g., digital data) that uniquely represents to the system one or more real or virtual things (e.g., a person, an information resource, an object, a piece of data, an action, etc.). In various implementations, the code page of data may be a QR code. A few examples are shown in FIGS. 12A, 12B and 12C. Referring to FIG. 12A, the QR Code represents an RSA Private Key. Referring to FIG. 12B, the QR Code represents a set of raw bytes of random data. Referring to FIG. 12C, the QR Code represents machine readable object code.

In various implementations, the code page of digital data can include various types of information that may be utilized by the system (e.g., by the processor mentioned above, or by another processor in the system) in any number of ways. For example, as disclosed below, the digital data in the code page may include units of data, each of which is (or represents) an identifier (e.g., a uniform resource identifier (URI), etc.), content (e.g., HTML content), executable machine code (e.g., computer code), or, in some implementations, some other abstract or tangible thing. An abstract thing may be, but is not limited to a concept. A concrete thing may be, but is not limited to, a good.

In some instances, a code page is a vector or array of bits that can be represented in 1 or 2 dimensions spatially, that contain digital data. This data may be generated, in whole or in part, by a true random number generator, a key generator as part of a public key infrastructure (PKI), machine-readable code, an identifier, or other types of digital data as desired within the system. For example, the data may itself be generated by an identifier. The code page is read out of the optical identifier by a reader that shines light at a particular set of conditions to generate the constructive and destructive interference via phase shifting inside the optical identifier to create a pattern of light and dark pixels. This pattern then falls on a 1D or 2D series of detector elements sensitive to the reader's wavelength generating electrical signals that represent electrically the digital data that make up the code page. A code page can contain different segments of data, or multiple code pages can be combined to form a larger segment of data as needed.

The media used to create the optical identifier can be varied depending on the desired wavelength and geometry of read-out. Many materials are available for creating the optical identifier. Some are optically sensitized through treatments or dyes included in their bulk, others are pure materials that are exposed to recording wavelengths that change their physical parameters in order to generate localized changes in refractive index. Examples of materials that could be used to create an optical identifier include but are not limited to Bayer™ HX films, dichromated gelatin, acrylic glasses, photosensitized polymer glasses such as phenanthrene-doped poly-methyl methacrylates, titanium niobate, positive or negative photoresists, photosensitized glass fibers, and silica fibers when recorded with excimer laser energy.

The code pages are recorded using techniques known in the art to spatially modulate the beam in an interferometer to create a desired interference pattern inside the recording media. Other possible methods include polarization multiplexing, peristrophic multiplexing, phase-coded multiplexing, spot-shift multiplexing, wavelength multiplexing, and spatial multiplexing. Other methods are known, as are combinations of more than one method of multiplexing to include more than one code page of data. Any of these could be used.

Many multiplexing methods are known, including angle-multiplexing as an example of a recording method. A laser interferometer is constructed a spatial light modulator (SLM) in the signal beam of the recording interferometer, and to configure that spatial light modulator to display the desired bit pattern at the time of recording each code page.

The interferometer configuration can then be changed in angle so each exposure is associated with a different code page of light and dark pixels when the optical identifier is illuminated in reconstruction at a corresponding geometry. The laser wavelength and angle must both be selected to create the appropriate reconstruction conditions for the code page at the wavelength the identifier is to be illuminated at during readout. The recording wavelength must also be suitable for the media used to construct the optical identifier.

These geometries should, in general, conform to the Bragg condition due to the thickness of the optical identifier. Thus angle is associated with its own unique series of dark and white pixels in the reconstructed bitmap, representing the digital data of that code page. The Bragg condition for reconstruction at a different wavelength than the construction wavelength can be calculated using the approximate coupled wave approximation of Kogelnik, the text of which is incorporated here by reference (Bell System Technical Journal Volume 48, Issue 9, pages 2909-2947, November 1969.)

As in many embodiments of the present invention the optical identifier has substantial volume, a great deal of information can be stored within, and the range of angles a particular code page is read at the detector is extremely limited. For example, using the methods of Kogelnik, an optical identifier that is 0.5 mm thick (credit card thickness) viewed with a red laser diode will have a range of angles it will show the code page in, with angle on the order of ~0.05 degrees. This is beyond the ability of human dexterity making the identifier difficult to tamper with outside its range of intended use. It is this quality that, in a typical implementation, allows the optical identifier to act as a security mechanism within the context of the IOT-Systems further described below.

It should be noted that the optical identifier may be multiplexed, and thus contain more than one code page for each angular position of the key as it is rotated. Each of these code pages may be used for a different purpose, or additional logic in the reader inside the lock may select a particular code page to be used out of a plurality of code pages as the identifying information.

As the identifier moves through angles, different code pages will be projected at the detector (camera lens). Each angle is thus associated with a different code page's reconstruction geometry per the Bragg condition.

In another aspect, a method of reading an optical identifier includes using a computer-based processor, for example, to cause a relay switch to connect power to (and thereby turn on) a laser. The light produced by the laser is directed toward an optical identifier (e.g., a solid piece of material that is translucent or transparent at least to the laser light) that has a code page of data (e.g., digital data) represented in a volume hologram in the solid piece of material. This produces an image that appears at a lens of a camera. The method further includes using the computer-based processor to cause or trigger the camera to take a picture of the image. In some implementations, the method includes storing the image, or digital data that represents the image, in a computer-based memory device. Moreover, in some implementations, the method also includes, after the image has been captured, causing (or allowing) the relay switch to disconnect power from (and thereby turn off) the laser).

In some implementations, one or more of the following advantages are present.

For example, the systems and techniques disclosed herein make it easy to transfer information (e.g., a code page) that is stored in one medium (e.g., a volume hologram in an optical identifier) into another medium (e.g., into digital data that can be stored by a computer-based system).

In some implementations, the systems and techniques disclosed herein do not require precise alignment between the optical identifier (e.g., in a volume hologram) and detector pixels. This is because the camera and lens are in a fixed position kinematically mounted in close proximity to the optical identifier during exposure and then confirming that the data can be read by the camera when directly observing the object beam (data code sheet) before exposure. After exposure, the reference beam reconstructs the optical identifier when the hologram is kinematically mounted in the same location relieving the need for precise alignment or an alignment procedure. Note: Kinematics is the branch of mechanics that deals with motion without reference to force or mass.

A reference beam is a laser beam used to read and write holograms. As a result, usually reference beams are Gaussian beams or spherical wave beams (beams that radiate from a single point) which are fairly easy to reproduce. The other beam used to write a hologram is the signal beam or object beam. (See, e.g., FIG. 13).

In some implementations, the systems and techniques disclosed herein use a camera having a high resolution array of pixels and the hologram is imaged onto the array with a lens. One advantage of this is that the entire optical identifier can be read out simultaneously as opposed to mechanically scanning for sequential readout. Additionally, the reference beam can be very low in power and the lens can be very small due to the high sensitivity of the camera. By way of example but not limitation a 5 Mega Pixel Raspberry Pi Camera can be used.

Another advantage present in some implementations is that the virtual image in the optical identifier is not visible to the naked eye. The convergence of the optical identifier may be such that without a very short focal length camera and lens, the optical identifier cannot be seen. It also has an advantage in that the image is virtual so a card placed in the image plane, for example, will not show the code sheet (e.g., the information represented in the optical identifier). (One alternative would be to reconstruct a real image that could be imaged onto a sheet of ground glass. The real image is an alternate to the use of a virtual image.). A virtual image is an optical image formed from the apparent divergence of light rays from a point, as opposed to an image formed from their actual divergence.

Another advantage, in some implementations, is that the system uses a fixed lens to image the optical identifier. Technically, a fixed lens camera is any camera that doesn't make use of interchangeable lenses. This has several advantages. For example, the first one is that the virtual image can be collimated (if the lens is a collimating lens) before focusing onto the detector array. A collimating lens is a lens used for producing parallel rays of light. This reduces the distortion of the image and makes interrogation of the optical identifier difficult. The lens and camera become integral to the reading of the optical identifier. Another advantage of using a fixed lens is that minor position variations of the optical identifier generally do not prevent the data code page from being read. There is a larger position variation possible during assembly which allows for less expensive and faster production.

According to one aspect, a system includes:
1. a power management subassembly (pms) that includes a power source (e.g., a DC battery) or an access point to a power source (e.g., an AC mini USB port);
2. computer-based memory;
3. an illuminating device;
4. a switch (e.g., a relay switch) coupled to the pms and adapted to switch on and off the illuminating device;
5. a communication bus;
6. an optical identifier (01) having a code page and positioned so that when the switch is closed, the illuminating device turns on and emits a beam of light to interrogate the code page and produce a projected image;
7. a digital camera coupled to a processor, where a lens of the imaging assembly of the digital camera is positioned to capture a representation of the projected image on the camera lens.

According to another aspect, machine code that represents a method (and the method itself that may be implemented by a system that includes a processor executing machine code) that includes: 1. providing a signal to a relay switch to close and thereby provide power to an illuminating device (e.g., a laser) to generate a beam of light to interrogate a code page represented in an optical identifier and produce a projected image; 2. actuating a camera to capture a representation of the projected image as digital data; 3. optionally, storing the digital data in computer-based (e.g., non-transitory) memory; and 4. disabling the signal to the relay switch to turn off the beam of light; and 5. interacting with (e.g., processing) the digital data. Some implementations include enabling a processor to perform actions required to satisfy and/or facilitate the algorithmic steps of the foregoing procedure.

In a certain implementations, the above-referenced process may relate to, or be applied to help establish or confirm identity (e.g., of a person), authentication of identity, authorization, authentication of authorization, and/or auditing. Code pages representative of digital data may be interrogated to generate corresponding units of digital data (e.g., in non-transitory memory) as digital data that can be acted upon by a computer-based processor, for example, executing machine code. In a typical implementation, the interrogation will include the algorithmic steps of the above-mentioned process.

BRIEF DESCRIPTION OF THE DRAWINGS

FIG. 1 is a schematic representation showing one exemplary implementation of an optical identification system (OIS) including some of the system's components.

FIG. 2 is a schematic representation showing another exemplary implementation of an OIS with solder points.

FIG. 3 is a schematic representation of yet another exemplary implementation of an OIS micro with micro USB power.

FIG. 4 is a partial schematic representation of still another exemplary implementation of an OIS that has mirrors.

FIG. 5 is a partial schematic representation of another exemplary implementation of an OIS that has mirrors and a mirror housing.

FIG. 6 is a partial schematic representation of an exemplary implementation of an OIS with a reflective hologram.

FIG. 7 is a schematic perspective view of an exemplary optical identifier unit.

FIG. 8 is a schematic representation showing two examples of optical identifier holding apparatuses.

FIG. 9 is a schematic representation showing an exemplary OIS with a holding apparatus for an optical identifier.

FIG. 10 is a schematic representation showing an exemplary OIS with an optical identifier holding apparatus with a reflective back surface.

FIG. 11 is a schematic representation of using duel reference beams.

FIGS. 12A-12C are examples of code pages of data.

Like characters represent like elements.

DETAILED DESCRIPTION

Figure 13:
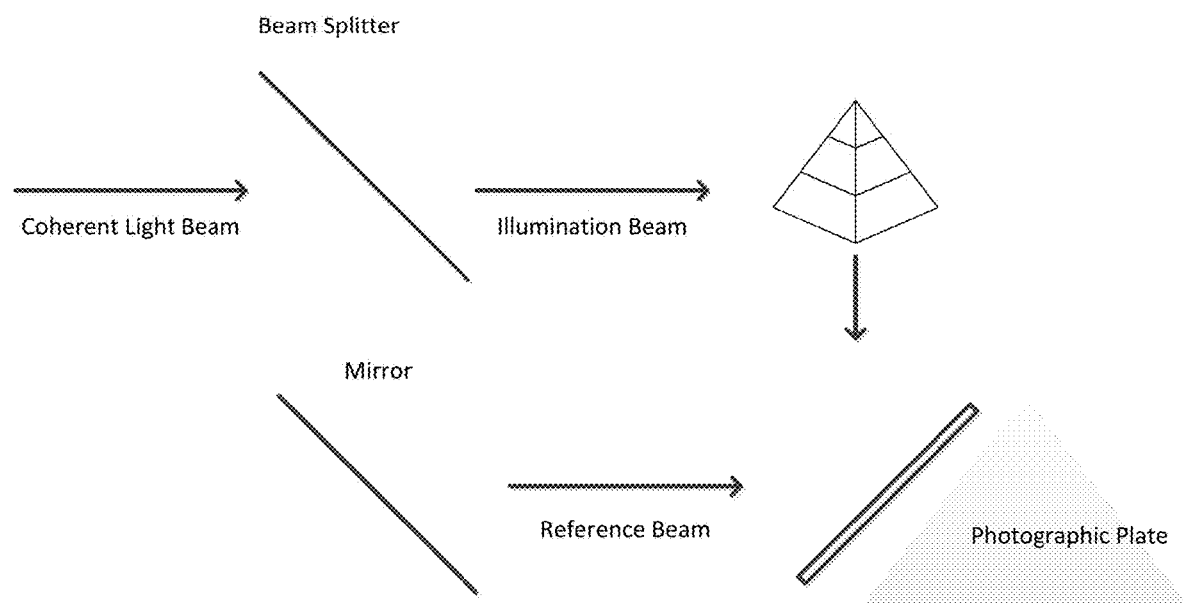
FIG. 13 is a schematic representation of a system for recording a volume hologram in an optical medium.

The systems and techniques disclosed herein have potentially broad applications. One particular application would be a use in connection with Graph of Things (GoT) technology, developed by NeurSciences, LLC. At a high level, GoT technology provides a framework to create, integrate, manage, and automate models about various Things. In GoT technology, a Thing represents something a machine can do as an action or something that an action can act upon. Related Things are organized in GoT technology to form a Graph of Things (GoT), and related graphs can be linked together to create a more sophisticated multi-dimensional GoT. This GoT is essentially an expandable digital brain that can be used by software-based GoT AI Agents (i.e., NeurBots, or simply NBs) that are connected to the GoT. The Things that are present in this digital brain represent the agent's knowledge (and abilities) at any given moment in time.

In general, each NB starts with the same general knowledge as every other NB. Each NB can evolve in a different direction from being an AI Agent with general knowledge to an AI Agent with highly specialized knowledge about a specific domain, such that, after some time has passed, any two NBs in a particular network may have very different sets of knowledge (and abilities). U.S. patent application Ser. No. 15/708,842, entitled Thing Machine, discloses certain additional information about Neurbots, Things, etc. That information in particular is incorporated by reference herein in its entirety.

Human users can use computers, laptops, tablets, and smart phones, to securely connect to their NBs. In this regard, each NB has its own unique identifier that a network of NBs can recognize; that unique identifier may be stored, for example, in a volume hologram on an optical substrate (e.g., a piece of glass or the like). Moreover, other Things and/or people may be assigned their own unique identifiers that are recognizable by a network of NBs; these identifiers too may be stored in volume holograms on optical substrates. Optical substrates can be used to store other types of data in the form of volume holograms.

In a typical implementation, the volume hologram is a hologram where the thickness of the recording material (e.g., glass or other optical substrate) is much larger than the light wavelength that was used to record the hologram. The data storage capacity of a volume hologram on an optical substrate is enormous. Therefore, the identifiers and other data discussed above that may be stored in a volume hologram on an optical substrate can be very long, which makes the inventory of possible identifiers very large and makes the identifiers and system that utilizes those identifiers very secure. In some implementations, an identifier in a volume hologram may have 20,000 bits or more.

There are many other potential advantages to storing this kind of information in a volume hologram on an optical substrate and adapting a system to be able to access and utilize the information. For example, volume holograms on optical substrates are largely impervious to electromagnetic pulse (EMP) attacks, surface scratches, and radio-frequency identification (RFID) interrogation. Moreover, volume holograms on optical substrates are fire resistant, and can be made shatter resistant. The data stored in a volume hologram on an optical substrate can be used for a variety of purposes—in an NB network or otherwise. For example, in various implementations, the data can be used to boot a machine or network to some predetermined state automatically, as an optical subscriber identification module (or SIM card), as a passport, as a driver's license, as an employee identification card, as an event entry card (or ticket), etc. In some implementations, different volume holograms on optical substrates can be logically paired, such that one optical identifier can be used by a network of NBs, for example, to authenticate a second optical identifier, for example. Many other uses are possible.

In some implementations, the NB is configured to operate according to a model of human cognition and/or to utilize blockchain-based technology to create a truly personalized, intelligent assistant or the like, that can learn, communicate, and/or conduct commerce on behalf of itself or its owner. In some implementations, a network of identifiable, secure, and smart NeurBot-based personal assistants may be utilized to unlock economic opportunities that span across all industries.

In a typical implementation, a NeurBot uses a NeurBot graph controller for its digital brain. There may be two basic models: a deterministic model and a non-deterministic model. The deterministic model provides well-defined behavior and tightly controls what the NeurBot can, and cannot do. The non-deterministic model enables the NeurBot to behave differently. In such implementations, the NeurBot graph controller organizes everything the NeurBot knows as a graph. The nodes in the graph may represent things that the NeurBot can do as actions, and things that the actions can act upon. In performing an action, the NeurBot graph controller can change the graph of what the NeurBot knows.

A NeurBot can be taught some basic goals to achieve, and, by performing actions, it can try to achieve those goals. It can be taught that some goals are more important than others, even for a brief moment in time. For example, one may want a particular NeurBot to be very interactive with a person, but otherwise spend its time reading digital books. Sometimes, goals can conflict, such as being interactive with a person or answering a call. The NeurBot can be taught to muse about the things that it knows and the things that it does not know, in order to better organize its thoughts and to identify areas that it should focus on learning or reasoning about.

Each NeurBot may evolve at its own pace. In some environments, it will learn faster than in others. A NeurBot with really good sensors, for example, can learn quite a bit about its environment, and adapt to its environment. NeurBots can also be designed to meet each other, and to share information. Essentially, like a student, a NeurBot can learn from a teacher.

Certain implementations of NeurBots are described in detail in U.S. patent application Ser. No. 15/708,842, which was filed on Sep. 19, 2017, and is entitled Thing Machine. That application, and particularly the material describing Neurbots and Things or Thing Machines in that application, is hereby incorporated by reference (and enclosed) in its entirety.

The systems and techniques disclosed herein can be utilized and applied to NeurBots and in NeurBot environments to facilitate identifying and/or representing within the NeurBot environment various things (e.g., identities, objects, actions, etc.). In this regard, information representing those things can be incorporated into a hologram (e.g., a volume hologram), and accessed (or read) and processed by the various components/systems disclosed herein that might feed the information into the NeurBot environment for example, In a typical implementation, a volume hologram is a type of photographic recording of a light field, and it is used to display a fully three-dimensional image of the holographic subject, which is seen without the aid of special glasses or other intermediate optics. The image is usually unintelligible (e.g., not visible) when viewed under diffuse ambient light. It is an encoding of the light field as an interference pattern of seemingly random variations in the opacity, density, or surface profile of the photographic medium. When suitably lit (e.g., with a laser), the interference pattern diffracts the light into a reproduction of the original light field and the objects that were in it (e.g., that represent the thing) appear to still be there, exhibiting visual depth cues such as parallax and perspective that change realistically with any change in the relative position of the observer.

In a typical implementation, a volume hologram is a hologram that is incorporated into some volume of material (e.g., a glass block), as opposed to a flat surface. In a typical implementation, utilizing a volume hologram, instead of a flat hologram, enables the incorporation of far more data, which may be desirable because the data representing the associated things can be much more complex and, therefore, more secure. Also, utilizing a more complex scheme for representing the associated things provides for a greater vocabulary for identifying different things.

At a high level, the optical identification system OISs (e.g., NB-OIS) disclosed herein is a system that is configured to access and/or process information stored in volume holograms on optical substrates. The OIS may be connected to a NeurBot, or into a NeurBot environment or network to facilitate identifying different things. This is one use of the OIS disclosed herein. However, it may be used in other applications, as well.

FIG. 1 is a schematic representation showing one exemplary implementation of an optical identification system (OIS) 100.

The illustrated OIS 100 includes: a laser 102, a camera 104, a computer-based processor 106, a computer-based memory 108, a (normally-open) relay switch 110, and a communication bus 112. An optical identifier 114 (incorporated into a volume hologram on an optical substrate) is positioned between the laser 102 and the camera 104. In a typical implementation, the volume hologram can be removed easily by hand from its position between the laser 102 and the camera 104, and a different volume hologram (with a different optical identifier 114) can be put in its place.

In the illustrated implementation, the computer-based processor 106 is coupled to the communication bus 112, to the camera 104, to the relay switch 110, and to the computer-based memory 108, and the relay switch 110 is connected to the laser 102. By way of example but not limitation the computer based processor can be a Raspberry Pi 3 Model B+ Mini Computer with High Performance Heatsink Set configured with a Raspberry Pi Camera.

In some implementations, the OIS 100 will include a physical holder or guide to receive, and hold, the optical identifier 114 between the laser 102 and the camera 104. The physical holder or guide may help ensure that any optical identifier placed therein is positioned correctly relative to the laser 102 and the camera 104 to ensure that an image of the data on the optical identifier is produced by virtue of the laser impinging the optical identifier 114 and is captured by the camera 104.

In a typical implementation, during operation, the processor 106 may receive an instruction (e.g., via the communication bus 112) to read or access information in the optical identifier 114, which is positioned, as shown, between the laser 102 and the camera 104. In response to receiving this instruction, the processor 106 sends a signal to the relay switch 110 that causes the relay switch 110 to close and thereby deliver electrical energy to the laser 102 causing the laser to turn on. In some instances, the instruction may be generated automatically when the optical identifier is positioned between the laser and camera.

When the laser 102 turns on, the laser 102 delivers laser light through its lens 2 toward the camera 104. In one implementation, this may include a 5 mW 532 nm Green Laser Module (3V 11.9 mm) from FastTech. Since the optical identifier 114 (with the volume hologram) is positioned between the laser 102 and the camera 104, the laser light passes through the optical identifier as it travels from the laser 102 toward the camera 104 creating a projected image (of the volume hologram) at a downstream side of the optical identifier 114. This projected image ends up at the lens 1 of the camera 104.

In a typical implementation, the processor 106, in response to receiving the instruction to read or access information in the optical identifier 114, also sends a signal to the camera 104 that causes the camera to capture the projected image at a time that corresponds to the projected image being produced at the lens 1 of the camera 104. The instruction that is sent to the camera 104 may be sent at the same time as, or shortly thereafter, the instruction is sent to the laser 102. In response to the instruction, the camera 104 takes a digital picture of the representation of the projected image, and, in a typical implementation, the processor 106 stores digital data representing the projected image in the computer-based memory 108.

In a typical implementation, after the laser 102 has been on for a certain period of time (typically very briefly, e.g., less than a millisecond or two), the processor 106 causes the relay switch 110 to open, thereby cutting off power to the laser 102 and causing it to stop producing the laser light. This, of course, terminates the projection of the image onto the lens 1 of the camera 104.

The data in the optical identifier 114 (in the volume hologram) can take any one of a variety of different forms. In one example, the data in the optical identifier 114 forms or includes a code page. A code page may be, e.g., a table of values that describes a character set used for encoding a particular set page may be a table of characters from a set of characters such as the set of ASCII characters. A code page may be an image. A code page could be a representation of analog data. Pretty much anything a picture can capture can be a code page. In some implementations, a code page is a QR code of characters, which may be combined with a number of control characters.

The computer-based memory can be used to store the digital data captured by the camera 104 and/or to store instructions (e.g., machine code) for certain processor 106 operations.

In certain exemplary implementations, an OIS may include:
1. computer readable media having machine code (and/or other data) stored therein;
2. a processor with memory configured to load and perform machine code from said media, during boot (e.g., the initial set of operations that a computer system performs when turned on), where the processor is connected to a relay switch that is connected to a laser, where machine code-triggered action of the processor enables or delivers a signal to the relay switch to enable the laser light (e.g., turn on the laser light beam), and, subsequently disables the signal to relay switch, e.g., to turn the laser light beam off);
3. the laser connected to the relay switch, where the laser is (preferably optimally) positioned so that when the processor enables the relay switch, the relay switch will enable or cause the laser to emit a laser light beam onto the surface of an optical identifier to illuminate a code page (stored as a volume hologram on an optical substrate of the optical identifier) to produce a projected image of the code page on a lens-1 of a digital camera; and where
4. the processor is connected to the digital camera, where the processor signals the camera to capture a representation of the projected image (e.g., by enabling an aperture subassembly of the camera) as digital data, which can be, and typically is, then stored in memory.

With respect to the aperture subassembly, in some implementations, a device called a diaphragm usually serves as an aperture stop, and controls the aperture. The diaphragm functions much like the iris of the eye—it controls the effective diameter of the lens opening . . . . A lower f-number denotes a greater aperture opening which allows more light to reach the film or image sensor.

Moreover, in certain exemplary implementations, in response to receiving on the communication bus 112, a communication representative of a request for the processor to perform an action, the processor performs machine code-triggered actions of:
1. signaling the relay switch to cause the laser to emit a light beam onto the surface of the optical identifier to illuminate the optical identifier under a particular set of conditions that include wavelength during reading, angle, polarization state of the reader beam, how the identifier is rotated about the axis of illumination, and other reconstruction parameters, and produce an image of the data (e.g., code page) from the optical identifier projected onto lens-1 of camera;
2. signaling the camera to take a digital picture of the representation of the projected image for storing as digital data in memory;
3. signaling the relay switch to disable the laser light (or simply removing the previously-applied signal) so that the relay switch opens);
4. algorithmically interacting with the digital data to generate a response to the request in memory; and,
5. communicating a representation of the response over the communication bus.

The foregoing processes, in some implementations, are intended to cover the case where a raspberry pi processor is executing machine code that interacts with an electromagnetic waveform device such as but not limited to a wireless receiver or a microphone, to receive a communication representative of a communicated request for the processor machine code to consider. The machine code considers the request by evaluating the request in the context of things in its vocabulary to compute a performable statement, and then performs machine code that performs the performable statement. This may result in a non-empty response. The machine code then performs the format machine code to format the response. The machine code then interacts with an electromagnetic waveform device, such as, but not limited to, the wireless transceiver or a configured speaker, to communicate a representation of the response as the response to the request.

In various embodiments, the communication bus 112 can be wired (by way of example but not limitation: a serial bus; an i2c bus; a bus wired to a mobile device dock or installed within an appliance's housing), can be wireless (using protocols such as Bluetooth, Zigbee, LoPAN, WiFi, or other wireless communication protocols), or can include a combination of wired and wireless communication technologies.

FIG. 2 is a schematic representation showing another exemplary implementation of an OIS 200. The OIS 200 in FIG. 2 is similar to the OIS 100 in FIG. 1. For example, the OIS 200 in FIG. 2 has the same basic components as the OIS 100 in FIG. 1 including a laser 102, a camera 104, a computer-based processor 106, a computer-based memory 108, a relay switch 110, and part of a communication bus 112. In some implementations, there is a physical holder or guide to hold the optical identifier between the laser 102 and the camera 104. However, in the OIS 200 of FIG. 2, these NB-OIS 200 components are configured (e.g., mounted) on a circuit board 214. with power (+) and ground (−) leads being connected to solder points (or terminals) 216a, 216b on the circuit board 214, and one or more communication ports (connected to a communication bus) provided as one or more solder points (or terminals) 216c on the circuit board 214. In one embodiment, a clock line (e.g., SCL) and a data line (e.g., SDA) of an i2c communication bus are used as the communication bus 112. In a second embodiment, the transmit (Tx) and receive (Rx) lines of a serial communication bus are used as the communication bus 112. In a third embodiment, the Tx, Rx lines are used along with a signal line as the communication bus 112.

FIG. 3 is a schematic representation showing another exemplary implementation of an OIS 300. The OIS 300 in FIG. 3 is similar to the OIS in FIG. 2. For example, the OIS 300 in FIG. 3 has the same basic components as the OIS 200 in FIG. 2 including a laser 102, a camera 104, a computer-based processor 106, a computer-based memory 108, a relay switch 110, and part of a communication bus 112, and all of these components are configured (e.g., mounted) on a circuit board 214. In some implementations, there is a physical holder or guide to hold the optical identifier between the laser 102 and the camera 104. The communication bus 112 in FIG. 3 includes an i2c clock line (e.g., SCL) and an i2c data line (e.g., SDA). Moreover, the power (+) and ground (−) lines of the NB-OIS 300 are connected to a micro USB (e.g., Female) Jack Port Socket Connector 316, and SCL and SDA are connected to solder points. Other embodiments can use other types of power connectors.

In certain embodiments, the NB-OIS (e.g., 100, 200, 300, etc.) and/or any or all of the NB-OIS components can be fabricated as a SOB (system on board). The SOB can be placed in a housing to secure the SOB and the NB-OIS components within the housing. The housing can be fabricated for the size of the SOB, and have exterior Tx and Rx solder points, for example, connected through the housing to the Tx and Rx of the NB-OIS board. Similarly, the housing can be fabricated to enable (or include) a power management system to provide power to the NB-OIS board, such as a cut-out for a micro USB jack to extend from the board through the housing, enabling a micro USB adapter to be connected through the cut out. For a reference design showing this type of connection, see, for example, the Raspberry Pi 3 micro USB jack. The phrase "power management system" should be construed broadly herein to include virtually any kind of power supply, such as a battery, an AC adaptor, etc. that provides the power to run the system (e.g., without overloading it).

There are many housings available that may serve this purpose or be adapted to serve this purpose. One example is a Pi-Supply Pi Poe Case, from Allied Electronics & Automation.

In some embodiments, one or more of the lines Tx, Rx, Power (+), Ground (−), are connected to general-purpose input/output (GPIO) pins positioned to enable a jumper wire to be pushed through a cut-out in the housing onto a said pin. The jumper wire extends from the pin, out through the housing. In a typical implementation, a GPIO pin is a generic pin on an integrated circuit or computer board whose behavior—including whether it is an input or output pin—is controllable by the program at run time.

In some embodiments, the housing is designed to house an NB-OIS board that is connected to a portable battery power management subsystem with a battery that is connected to a QI charging receiver. QI is an open interface standard that defines wireless power transfer using inductive charging over short distances. In a typical implementation, the system may use a charging pad and a compatible device, which is placed on top of the pad, charging via resonant inductive coupling. The QI charging receiver is placed with the housing such that the QI charging receiver will be within the manufacturer specification of required proximity to a Universal Qi Wireless Charging transmitter when the housing is placed on a said transmitter to enable the battery to be wirelessly charged. The housing can be fabricated for the size of the SOB. The connection of the Tx and Rx lines from the board to the exterior of the housing can be through the use of solder points or pins to which jumper wires can be attached. In some implementations, an alternative type of connection may be used.

FIG. 4 is a schematic representation showing part of an exemplary OIS 400. The part of the OIS 400 shown in FIG. 4 has a laser 102 (with lens 2), a camera 104 (with lens 1), an optical identifier 114, and mirrors 418a, 418b. The mirrors 418a, 418b, in the illustrated implementation, are configured to direct laser light exiting the optical identifier toward the lens 1 of the camera 104. More particularly, in the illustrated implementation, the laser 102 emits a light beam from lens-1 onto optical identifier (O.I.) to illuminate an embedded hologram as an image onto a reflective front surface of mirror-1 418a that reflects off of mirror-1 418a onto a reflective front surface of mirror-2 418b, which is positioned to further reflect the image onto lens-1 of camera-1. The mirrors in the illustrated implementation are front surface mirrors, meaning that the front surfaces of those mirrors (that are shown to be reflective in the illustrated figure) are, in fact, reflective.

The mirrors in the configuration shown in FIG. 4 are configured so that the laser light travels in a first direction from the laser lens 2 to mirror-1 418*a*, so that the laser light travels in a second direction (orthogonal to the first direction) from mirror-1 418*a* to mirror-2 418*b*, and in a third direction (parallel to, but opposite the first direction) from mirror-2 418*b* to the lens-1 of camera 104.

The configuration in FIG. 4 represents only one of many possible OIS configurations that could involve mirrors. Indeed, any number of mirrors (e.g., one or more) may be configured and used to direct laser light along a path from the laser, through the optical identifier, and to the camera. In some implementations, one or more of the mirrors may be positioned "upstream" (on the laser light path) from the optical identifier. In some implementations, one or more of the mirrors may be positioned "downstream" (on the laser light path) from the optical identifier. In some implementations, one or more of the mirrors may be positioned "upstream" (on the laser light path) from the optical identifier, and one or more of the mirrors may be positioned "downstream" (on the laser light path) from the optical identifier. Some implementations may include (in addition to or instead of the one or more mirrors), one or more other types of optical elements (e.g., lenses or the like) to direct, focus, collimate, etc. the laser light in a desired manner. Any such optical elements (mirrors, lenses, or the like) can have a variety of different physical and optical configurations.

FIG. 5 is a schematic representation showing part of an exemplary OIS 500. The OIS 500 in FIG. 5 is similar to the OIS 400 in FIG. 4. For example, the OIS 500 in FIG. 5 has a laser 102 (with lens 2), a camera 104 (with lens 1), an optical identifier 114, and mirrors 418*a*, 418*b*. Additionally, mirror-1 and mirror-2 in the OIS 500 of FIG. 5 are placed in a retractable mirror housing 520 such that an action can be performed to move the housing to expose lens-1 of the camera 104. In some embodiments, the action may include lifting, sliding, pushing, pulling, turning, etc. The action may be mechanical, electrical, or manual.

This can serve several purposes. Firstly, in some embodiments, the laser light interrogates the hologram and projects an image onto the mirror which is then bounced onto another mirror and then back to the camera. If the mirror housing is moved, then the image might be projected in a straight line. This means we could effectively project the image outside of the current unit if we put a small hole in the raspberry pi housing unit (at the correct position of course). If we can project it to the external world, then we could use this to communicate with an external machine. Secondly, if we move the mirror housing, it means we could have a clear line of site back to the camera. Again, a second similar device could have its mirror housing retracted, and it could project an image onto the camera of this first unit. The idea is similar to "pairing" but done optically.

The mirror housing 520 can be positioned to enable the O.I. 114 to be interrogated and the mirror housing retracted to enable the camera lens-1 field of view to not be obstructed by the mirror housing 520. In a handheld unit, the operator can retract the mirror housing and use the device to produce an image onto a second device's camera to optically communicate information from the first device to the second device. In some implementations, one can build a raspberry pi with the relay, laser, camera, mirror housing, and power management system provided by a battery. One can put all this in a housing, and then you have a handheld version of the device.

FIG. 6 is a schematic representation showing part of an exemplary OIS 600. The part of the OIS 600 shown in FIG. 6 has a laser 102 (with lens 2), and a camera 104 (with lens 1). An optical identifier 114 is positioned in a light path from the laser 102 to the camera 104. There is a reflective surface 602 at a side of the optical identifier 114 opposite the side of the optical identifier 114 where the laser light enters the optical identifier 114. A volume hologram (with a code page, for example) in inside the optical substrate of the optical identifier 114 between the surface of the optical substrate through which the laser light passes and the reflective surface 602 inside the optical substrate, or on the reflective surface 602. The reflective surface 602 can be part of a mirror or can be reflective coating, for example. Both the laser 102 and the camera 104 are angled relative to the optical identifier 114 and the reflective surface 602 is configured such that laser light from the lens 2 of the laser 102 can pass through the optical identifier 114 at an angle, reflect off the reflective surface 602 at another angle and reach the lens 1 of the camera 104 directly. The reflective surface 602 in the illustrated implementation is substantially parallel to the surface of the optical substrate through which the laser light passes.

Thus, in the illustrated implementation, during operation, the laser 102 produces a laser beam and emits that laser beam from lens-2 onto optical identifier (O.I.) 114. The laser light enters the optical identifier 114 through its front surface. Inside the optical identifier, the laser light illuminates a volume hologram that may be coated on or affixed to a reflective backing or placed in front of a mirror. The laser light exits the front surface of the optical substrate and creates an image on lens-1 of camera 104. The camera 104 captures the image. Generally speaking, in a reflection hologram, a reference wave and an object wave entering an emulsion (or light sensitive coating) from different sides produces interference fringes in planes that are parallel to the plane of the emulsion. The image can be observed by viewing the reflection from the plate.

In some embodiments, the image (e.g., of the code page or other data in the volume hologram) is a real image. In some embodiments, the image is a virtual image. In optics, a virtual image is an image formed when the outgoing rays from a point on an object always diverge. The image appears to be located at the point of apparent divergence. Because the rays never really converge, a virtual image cannot be projected onto a screen. In contrast, a real image is one that is formed when the outgoing rays form a point converging at a real location. FIG. 7 shows an exemplary implementation of an optical identifier that includes an optical substrate 721 and a volume hologram 722 in the optical substrate 721. The illustrated optical identifier may be manufactured with a section of the unit (or optical substrate) removed (to form a cut-out section) and the hologram 722 is placed on a material (e.g., another piece of optical substrate) that can be affixed over the cut out section. One can think of it like a credit card (e.g., a flat substrate) with a hole in the middle of it. The hologram is placed onto a sticky adhesive that is placed over the hole. This way, when the light (e.g., laser light) hits it, the image can be transmitted out the other side.

FIG. 8 shows two different holding apparatus configurations for an O.I. Any one of these holding apparatuses can be used to hold an optical identifier in place in any of the optical identification systems (e.g., 100, 200, 300, etc.) disclosed herein. Referring to FIG. 8, the O.I. 114 can be positioned in an O.I. holding apparatus (e.g., a channel 824*a* or a tray 824*b*) appropriately positioned between the lens of an illuminating device (e.g., laser), and the lens of a camera. In one embodiment, the O.I. holding apparatus 824*a* is a channel with a flat bottom and two sides that extend orthogonally, in an upward direction from opposite sides of the flat bottom. The channel is dimensioned so that the optical identifier 114 can be slid (in an upright configuration, as shown) into the channel, and so that the two sides of the channel contact or are very close to the front and rear surfaces of the optical identifier 114. In a second embodiment, the holding apparatus 824b is a tray 824b with a transparent core, a cut-away core, or other such design where the optical identifier 114 can be securely placed; and where the laser can be positioned to illuminate the optical identifier 114 and project the image onto the camera lens. The tray 824b in the illustrated implementation has a flat bottom surface and four side surfaces that extend orthogonally in an upward direction from the bottom surface. The holding apparatus can be manufactured in other form factors as well, and may be configured as required for the purpose of the desired assembly.

In a typical implementation, the holding apparatus, whatever its configuration, is in a fixed position relative to the laser, or the camera, and, preferably, both. This way, when the optical identifier 114 is positioned in the holding apparatus, the optical identifier will be correctly positioned to be read. An example of this is represented in FIG. 9.

The system represented in FIG. 9, includes an O.I. reader holding apparatus (H.A.) 924 such as a mount, where an O.I. can be positioned within the mount to enable interrogation of the O.I. volume hologram.

In some implementations, the holding apparatus 924 has a contact switch (not shown) that is configured so that when contact with the contact switch occurs (as might happen when the O.I is placed into the holding apparatus), the contact switch is triggered, which results in the laser 102 turning on and emitting a light beam onto the volume hologram of the O.I. positioned in the holding apparatus, to produce an image on lens-1 of camera 104. In some implementations, the contact switch will also be configured such that contact with the contact switch (e.g., when the O.I. is placed into the holding apparatus) causes the camera to capture any image being projected onto its lens. More particularly, the camera aperture apparatus can be enabled to take a picture of the image as digital data to be stored in non-transitory memory. In various implementations, the contact switch may be positioned in the bottom surface of the holding apparatus or in any side surface of the holding apparatus.

In other implementations, the holding apparatus may include a non-contact sensor (instead of the contact sensor mentioned in the previous paragraph) to sense the presence of an optical identifier in the holding apparatus. Examples of non-contact sensors are capacitive sensors, infrared sensors, etc. In those implementations, the non-contact sensor may be configured to perform a function similar to the function described above as pertaining to the contact sensor.

In one embodiment, the O.I. is permanently mounted in the holding apparatus 924. In a second embodiment, the O.I. is easily removable from the holding apparatus. For example, one can place a hologram into a holding apparatus, and encase the whole thing in a housing. This means the manufacturing process for a IoT device can be assembled to mass produce things with a hologram already built in. Each device would include machine code that can use the hologram to provide the device with an identity and identifiers.

FIG. 10 is a schematic representation showing part of an exemplary optical identification system (OIS) 1000 for reading an optical identifier. The part of the OIS 1000 shown in FIG. 10 has a laser 102 (with lens 2), a camera 104 (with lens 1) and a holding apparatus 1024 for an optical identifier (having a volume hologram therein, as described herein). There is a reflective surface 1026 at a side of the holding apparatus 1026 opposite the optical identifier. During operation, the laser 102 transmits light at a first angle (e.g., between 20 and 80 degrees from normal to the front surface of an optical identifier in the holding apparatus 1024. The light passes through the optical identifier in the holding apparatus, is reflected back off of the reflective surface 1026 at a second angle (the same as the first angle, but in the opposite direction), and passes back through the optical identifier. The reflected light exits the optical identifier and impinges lens 1 of camera 104. The camera 104 captures an image of the volume hologram based on the reflected light.

In the FIG. 10 implementation, the holding apparatus includes the mirror backing (or reflective surface) so that the optical identifier itself does not need a reflective backing. In some implementations, however, the optical identifier might have a reflective surface on one side thereof, and, in those implementations, the holding apparatus would not need to include the mirror backing (or reflective surface) to produce a reflected hologram.

Some embodiments may forgo the holding apparatus and simply have the laser lens on the exterior of the device housing and the camera lens on the exterior of the device housing so that a user can simply hold a reflective hologram up to the machine and have the laser light beam positioned to interrogate the hologram and the reflective coating reflect the image onto the camera lens. In such an implementation, the processor (executing the machine code) periodically runs the camera's machine code driver to cause the camera aperture apparatus to capture an image, and attempts to algorithmically decode the image code page as digital data. In some implementations, this is the case where it is looking for a QR code to scan. So it periodically is running the machine code to take a picture, and attempting to see if it can recognize a QR code.

In some embodiments, a processor may be configured to perform (e.g., by executing computer-readable instructions) the following steps (which may be performed in this sequence):

1. signaling a relay switch to provide power to the laser 102 and thereby cause the laser 102 to emit a light beam onto the surface of an (appropriately positioned) optical identifier O.I. 114 to illuminate the optical identifier 114 under a particular set of conditions (e.g., including wavelength during reading, angle, polarization state of the reader beam, how the identifier is rotated about the axis of illumination, and other reconstruction parameters), and create an image projected onto lens-1 of camera 104;
2. signaling the camera 104 to take a digital picture of the projected image as code page digital data, which may be stored in memory; and
3. signaling the relay switch 110 (or allowing the relay switch) to discontinue providing power to the laser 102 and thereby disabling the laser light (e.g., after the digital picture has been taken).

The code page digital data captured in the digital picture taken by the camera can be used by the system (e.g., the NO-OIS 100) in a variety of ways.

For example, in some embodiments, the code page digital data is stored once in the computer-based memory 108 and may be accessed and interacted with as needed using algorithmic steps embodied as machine code (e.g., performed by the processor 106). In those embodiments, the code page digital data may be retained in the computer-based memory until the NB-OIS (e.g., 100) is shutdown, and/or beyond that point. Thus, the code page can be retained in memory so that whenever any algorithmic step (e.g., a step of any algorithm being executed by a computer-based processor, for example) requires the use of the data, it is already in memory and need not be reimaged.

In some embodiments, the processor 106 (executing machine code), or other processor(s), may perform actions to generate a random number (e.g., by using a random number generator), encrypt the code page digital data (using the random number), and retain the random number in the computer-based memory so that the stored random number can be used later (e.g., by the processor 106, or some other processor) to decrypt the encrypted code page digital data when required. This is so that if the machine were hit with a memory grab, for example, then the memory may not have the decrypted content of the code page. In an embodiment, machine code (software) is performed to generate a cipher key, such as but not limited to using a pseudo random number generator algorithm. The processor further executes machine code designed to perform the algorithmic steps of a cipher that acts upon the cipher key and the digital data representative of the code to cipher the data. This is so that if the machine were hit with a memory grab, for example, then the memory may not have the decrypted content of the code page.

In yet another example, in some embodiments, the code page digital data is retained in the computer-based memory 108 for a relatively short period of time only to enable the processor 106 to perform algorithmic steps of a procedure that requires or relies upon the code page digital data, and is then unset (deleted) from the computer-based memory 108. In these types of embodiments, the machine code may cause the processor 106 to perform actions of:

1. signaling the relay switch 110 to connect power to (and therefore cause) the laser 102 to emit a light beam onto the surface of an appropriately positioned optical identifier O.I. 114 to illuminate the optical identifier 114, which produces an image that is projected onto lens-1 of camera 104;
2. signaling the camera 104 to take a digital picture of the representation of the projected image as code page digital data, which may be stored in the computer-based memory 108; and,
3. signaling the relay switch 110 to disconnect power from the laser 102 and thereby disable the laser light (after the digital picture has been taken);
4. performing one or more algorithmic steps of a procedure (e.g., embodied as machine code) that involves accessing and interacting with the code page digital data to set a second memory required in performing an algorithmic step; and
5. after the procedure is performed, executing machine code to overwrite the code page digital data in the computer-based memory (e.g., with all zeros).

In an embodiment, machine code is performed to generate a cipher key, such as but not limited to using a pseudo random number generator algorithm. The processor further executes machine code designed to perform the algorithmic steps of a cipher that acts upon the cipher key and the digital data representative of the code to cipher the data. This is so that if the machine were hit with a memory grab, for example, then the memory may not have the decrypted content of the code page.

Moreover, in an embodiment, the algorithmic steps of a procedure, embodied as machine, are performed by the processor to perform the steps of accessing and interacting with the code page of digital data to set a second memory required in performing an algorithmic step of a procedure. By way of example but not limitation, the memory may be representative of a boot block address required by a procedure to boot a machine, a key to cipher data, or a hash key to match against the computed hash of a second memory.

In some implementations, an optical identifier includes a single code page of digital data. However, in some implementations, a single volume hologram (in a single optical identifier) includes more than one single code page of digital data. And the foregoing embodiments can be adapted to capture and process more than one single code page of digital data (e.g., simultaneously). By way of example but not limitation, the embodiment can configure the laser to use multiple wavelengths and or position it for multiple angles. Similarly, an embodiment can use multiple light emitting devices and cameras.

Code Page Digital Data as Units of Digital Data

The code page digital data can include a set of units of digital data where a unit of digital data is an embodiment of digital data in non-transitory memory that an implementation of an algorithmic procedure, embodied as machine code, can act upon. Thus, for example, there can be multiple discrete units of digital data wherein a first machine code might act upon a first unit, and a second machine code might act upon the second. The data representation typically is dependent on the base numbering system used. For example, in decimal, the data is 0-9, in hex 0-16. Note that in hex, 0-16 is 0-F. Thus, in hexadecimal 16 may be written as F so hex includes 0-9 and A-F. The data may be encoded as a QR-Code and, if that is the case, then the volume hologram image may look like a QR code. The benefit is a QR Code has built in error checking. Note though, it does not have to be QR Code. Some alternative with built in error checking could be used.

Each one or more units of digital data in a code page of digital data can be an identifier, content, machine code, a thing (or representative of a thing), and/or a unique identifier. Digital data can be treated as if it were one unit of data, like all the digital data that represents a single photo. Alternatively, it can represent units of digital data such as an identifier, content, machine code, a thing, a unique identifier, etc.

Unit of Digital Data as an Identifier

In some embodiments, one or more of the units of digital data (in a code page of digital data) can be recognized (e.g., by the OIS or by an NB network connected to the OIS) as an identifier. By way of example, but not limitation the identifier may conform to a published specification such as:

1. An Internet Society published standard, in which case, the one or more units of digital data may be:
   a. an International Resource Identifier as defined, for example, by the current published Internet Society Standards Organization, such as RFC 3987; or,
   b. a Uniform Resource Identifier as defined by the current published Internet Society Standards Organization, such as RFC 3986;
2. An International Standard, such as the International Mobile Subscriber Identity as defined by the International Mobile Subscriber Identity (IMSI) Oversight Council (IOC);
3. A GS1 standard, in which case, the one or more units of digital data may be GS1 Identification Keys, EAN/UPC, (International or European Article Code/Universal Product Code).

Unit of Digital Data as Content

In some implementations, one or more of the units of digital data can be representative of digital content (e.g., stored in non-transitory memory). By way of example, but not limitation, the digital content may conform to a published specification such as:
1. HTML 5.1 2nd Edition, W3C Recommendation 3 Oct. 2017;
2. Extensible Markup Language (XML) 1.0 (Fifth Edition), W3C Recommendation 26 Nov. 2008;
3. A WHATWG HTML specification, such as Microdata; or
4. A schema.org specification such as a published Schema.

Digital Data and Machine Code

In some implementations, one or more of the units of digital data can be (or be representative of) machine code that the processor (e.g., 106) can execute to perform an associated action. In one example of such an embodiment, the machine code can be for a program that is executable by a computer processor (e.g., 106). The system may load the program (machine code) into executable memory (e.g., computer-based memory 108) for performing (e.g., by the processor 106).

In this regard, the NB-OIS processor 106 may perform actions comprising the steps of:
1. loading a unit of digital data representative of machine code into executable memory (e.g., computer-based memory 108); and,
2. performing one or more actions based on the machine code loaded into the executable memory.

In this regard, the NB-OIS processor 106 may perform actions comprising the steps of: computing by interrogating an optical identifier a unit of digital data representative of machine code; loading said code into executable memory; and, performing said machine code. This method precludes malware from being injected into the encoded machine code after the optical identifier has been produced.

In some instances, the machine code (i.e., that was encoded into the hologram) is dynamically loadable machine code (such as a shared library or a dynamic link library) and the machine code is dynamically loaded and performed. Dynamic loading is a mechanism by which a computer program can, at run time, load a library (or other binary) into memory, retrieve the addresses of functions and variables contained in the library, execute those functions or access those variables, and unload the library from memory. Dynamic loading allows a computer program to start up in the absence of these libraries, to discover available libraries, and to potentially gain additional functionality.

In some implementations, one or more of the units of digital data is an identifier representative of an entry point in code (e.g., the dynamically loadable machine code), where the machine code is loaded into executable memory and the entry point resolves to an executable address in the executable memory, and the NB-OIS processor performs actions in accordance with the machine code at the address.

In some implementations (e.g., in a Thing Machine), one or more of the units of digital data are representative of a statement that a first verb action can parse as a first graph of Things that a second verb action can evaluate in the context of the domain of discourse to compute a second graph of Things representative of a performable statement that a third verb action can cause the performance thereof. In a Thing Machine embodiment machine code is performed to manage a set of Things each as a unit of non-transitory memory wherein each Thing is comprised of the same set of components including a first identifier, a value, and a relationship set describing how a first Thing relates to a second Thing. A Thing representative of performable machine code is referred to as a machine verb action and the Thing's identifier is a name representative of the action. A machine verb action can act upon a set of Things referred to as machine nouns. A Thing can be representative of a machine vocabulary including machine verbs, machine nouns, and other Things that modify meaning. A set of Things can represent a statement. The Thing Machine's vocabulary includes:
- an "interrogate" machine verb to perform the action of interrogating an optical identifier to compute code page digital data;
- a "parse" machine verb to perform the action of parsing the digital data to compute a Thing representative of a statement;
- an "evaluate" machine verb to perform the action of evaluating the statement in the context of the machine vocabulary to compute a performable statement; and
- a "perform" machine verb to act upon the performable statement Thing to perform a machine verb identified in the performable statement.

In some implementations, one or more of the units of digital data is (or represents) a statement that can be performed by a computer processor executing machine code representative of an interpreter. By way of example, this may be a statement that a Linux bash shell can interpret and act upon.

Digital Data as a Thing

In an embodiment of a Thing Machine (from NeurSciences LLC), one or more of the units of digital data can be representative of Things that a P(TM(i)) can act upon. A P(TM(i)) may be considered a process that can be performed by a Thing Machine.

By way of example, but not limitation, a unit of digital data can be (or represent):
1. an authorization;
2. machine code to be loaded into the processor 106 and performed by the processor 106;
3. a URI;
4. a URR;
5. a symmetric key;
6. an asymmetric public key;
7. an asymmetric private key;
8. a cipher key;
9. a hash key;
10. a performable action;
11. a statement to be parsed;
12. a request for the processor to evaluate;
13. a primary key for a database lookup;
14. an identifier;
15. a machine code; or
16. content to be acted upon by a Thing Machine.

Unique Identifiers

A unique identifier (UID) is a sequence of characters that is associated with, and identifies to the system, one or more entities, for example, within the system. A driver's license number in a given state, an employee badge number in a company, a bank account number within a particular bank, and a unique serial number of a subscriber identification module (SIM) card are examples of unique identifiers.

In some implementations, the processor 106, for example, can execute machine code to act upon an identifier to compute a unique identifier. By way of example, but not limitation, the processor may perform in accordance with machine code to act upon a representation of a first identifier, and a representation of a second identifier, to compute a third identifier such as by performing a hash procedure. An exemplary implementation of an algorithmic procedure that may be performed by the processor executing machine code includes the actions of:

1. computing a candidate unique identifier (and saving it, e.g., in non-transitory memory);
2. searching a set of previously-computed, issued unique identifiers (e.g., in non-transitory memory loaded, e.g., from non-transitory computer readable media), to compare the candidate unique identifier to the members of said set; and
3. if candidate unique identifier is in the set of issued unique identifiers, then discarding the candidate unique identifier and continuing the action sequence starting at step 1; or
4. if the candidate unique identifier is not in the set of issued unique identifiers, adding the candidate unique identifier to the set of issued unique identifiers (e.g., in the non-transitory computer readable media).

Step 2 here may be performed, for example, to make sure that the candidate is not already in existence.

This may include computing a hash key as a candidate unique identifier (and saving it, e.g., in non-transitory memory). Essentially, a hash key is computer, and then the operating system is used to "create" an API to try and create a file by this name. If the file already exists, then the create API fails so the system concludes that the identifier is not unique.

In some embodiments, the unique identifier can be a unit of digital data, and an operating system service can be used to ensure the candidate identifier is unique (i.e., step 2, above, i.e., it does not already exist in a set of issued unique identifiers). By way of example, an operating system service can create a file in a file system with a file name representative of the candidate unique identifier. If the file already exists, then the operating system's create file service will fail and the machine code will continue with step 1 (above). Note that in this embodiment, the set of issued unique identifiers is the set of created files.

A representation of the issued unique identifier can be used to identify a Thing in a Thing graph as administered by a P(TM(thing)) of a P(TM) of a Thing Machine where machine code causes a processor to perform the action of:

1. performing machine code to compute an asymmetric public key and private key, key pair (and storing it, for example, in memory);
2. performing machine code to interact with the asymmetric public and private keys, and issued unique identifier (e.g., in memory), to generate (and store, e.g., in memory) a representation of a certificate signing request including a representation of said public key and of said issued unique identifier;
3. performing actions, based on the machine code, to interact with the certificate signing request to compute an issued certificate (e.g., to be stored in memory);
4. recording in a file (e.g., in computer readable media) the issued certificate (or a representation thereof) where the filename of the file is (or represents) the unique identifier; and
5. recording in a second file (e.g., in computer readable media) the private key (or a representation thereof) where the filename of the file is (or represents) the unique identifier and where the filename has a suffix identifier, such as ".pkey" or ".private".

Some instances include the algorithmic procedures of a data storing and/or executing a retrieval model, such as the procedures associated with a data access object, a file system, a DBMS, or cloud service such as Amazon's cloud service, embodied as machine code, to provide the action of storing either the digital data itself, or a representation of it (such as an encoded version) such that, a processor executing machine code can subsequently retrieve the representation.

Some embodiments include the algorithmic procedures of non-transitory computer readable media data management such as to set a representation of digital content in, or on, the media; to get the representation; and/or to unset the representation.

In some embodiments, the systems and/or techniques disclosed herein enable representing a unique identifier to be encoded in a volume hologram and subsequently decoded (e.g., and stored into memory). The number of character positions within the identifier, and the number of possible characters in each position can be sufficiently long to create a large set of possible unique identifiers. Furthermore, a pure random number generator and, or analog device capturing random noise in nature, such as atmospheric noise, can be computationally used to further create uniqueness of the identifier.

Holographic memory, including, for example, volume holograms, has the potential of high capacity data storage. In various implementations, information may be recorded such that all the data is recorded in multiple parts (or every part) of the hologram so if part of the hologram is damaged or unreadable, the data can still be recovered. Data can also be multiplexed by wavelength or by angle or incident light on the same area. In those instances, the OIS may be configured to move the media (i.e., the optical identifier) or change the laser wavelength being provided to the volume hologram during reading. In instances where the media is to be moved, the optical identifier can be moved to access different data by an electrical motor (controlled by the processor, for example) that rotates or otherwise moves the holding apparatus during reading. In addition, or alternatively, if different wavelengths are to be provided to read the volume hologram, the laser (or a laser assembly, with different lenses, for example) may be configured to provide different wavelengths of light into the optical identifier, under control of the processor. In some instances, the data in a particular volume hologram may be stored in parallel and read in parallel so all the data can be read at once which makes holographic memory extremely fast.

In one implementation, one or more bar codes and/or QR codes may be recorded into a volume transmission hologram. A camera then observes the virtual image/images when reconstructed with laser which is interpreted by software to convert the image to text. Thereby, this QR code can be used as a "key" to encode private data and gain access to public data.

In one implementation, one or more bar codes and/or QR codes may be recorded into a volume transmission hologram. An illuminating device interrogates the hologram to project an image. A camera then observes the virtual image/images when reconstructed with laser. Machine code is performed to interact with the camera to capture a representation of the image as digital data which is interpreted by machine code that computes and saves in memory a representation of the corresponding text.

In some implementations, the systems and techniques disclosed herein provide a secure means of storing data which cannot be readily read without the aid of an optical interrogator (e.g., OIS). The optical interrogator thus becomes integral to the data storage. In some implementations, the data storage is accomplished by using holographic memory (e.g., a volume hologram in an optical substrate) which is fast, secure, and difficult to reproduce or copy, has high data density, is very small, and is very inexpensive. The holographic memory can be used as a key to encrypt private data, a key to access public data, data or a source of data in itself, etc. It can be used as a secure data key storage for Bit coin transactions or credit card data.

In some implementations, an optical interrogator (OI) comprises: a) a coherent light source (e.g., a laser), b) a diverging lens, c) one or more mirrors, d) a volume hologram of a QR code (or bar code, or some other data format), e) a camera, f) a laser/computer interface, g) a computer (e.g., Raspberry PI), and h) software for converting, e.g., the QR code to text or data. The volume hologram can be a transmission hologram of a QR code. The volume hologram can be a reflective hologram of a QR code. The volume hologram can be a transmission hologram of a bar code. The volume hologram can be a reflective hologram of a bar code.

In some implementations, the holographic QR code stores some number of characters (e.g., 256 or more) that can be imaged by the camera and interpreted by QR code reader software. In some implementations, the holographic memory is no greater than 5 mm×5 mm.

The converted text can be used as a "key" to encrypt private data. The converted text can be used as a "key" to allow access to public data. In some implementations, a volume hologram can be used to store a QR code as an encoding key to encrypt private data. In some implementations, a volume hologram can be used to store a QR code as a software "key" to enable access to public data.

In some implementations, the systems and techniques disclosed herein involve an optical identifier that has more than one code page in the optical identifier, and using more than one laser beam to illuminate the more than one code page (either simultaneously or sequentially). An example of this kind of system is shown in FIG. 11. The system in FIG. 11 includes two lasers 1102a, 1102b that are directed toward the optical identifier 114 from two different directions. Each of the two lasers 1102a, 1102b is controlled (i.e., turned on and off) based on input from its own relay switch 1110a, 1110b. These relay switches can be configured to energize the lasers sequentially or simultaneously. The camera is controllable to capture an image whenever any one of the lasers is being energized. A power source is shown in the form of a battery 1150.

In some such implementations, the more than one laser beam can be controlled to readout different multiplexed code pages represented in the volume hologram with no moving parts. Using multiple code pages in a single optical identifier, and more than one laser beam to illuminate those multiple code pages, can increase the amount and types of information that can be stored in a single optical identifier.

There are many ways in which one or more volume holograms can be recorded into an optical medium. In one example, a laser beam is split into two parts (see, e.g., FIG. 13). One part illuminates with linear polarization an object mask of a QR code is made using ground glass and opaque material. Holographic recording material is placed a short distance away from this illuminated mask and normal to it. The second part is slightly diverged or converged or collimated based on the reconstruction wavelength and illuminates the hologram at an offset angle (typically 45 degrees to 55 degrees). After development, the hologram can be placed in the optical interrogator where the hologram may be illuminated with the reference beam. This illumination is at the same angle and the construction if the reconstruction wavelength is the same but will greater if the reconstruction wavelength is longer and smaller if the reconstruction wavelength is shorter. The size of the QR code image is larger if the reconstruction wavelength is longer and the QR code image is smaller if the reconstruction wavelength is shorter. One of the unique features of this QR code is the extremely low noise. The low noise is achieved through unique construction geometry and allows the storage of 256 characters or more to be stored in the QR code and read by the camera in the optical interrogator.

A number of embodiments of the invention(s) have been described. Nevertheless, it will be understood that various modifications may be made without departing from the spirit and scope of the invention.

For example, the disclosure herein explains that a laser can be used to direct light toward an optical identifier to illuminate the volume hologram thereupon. However, other illumination sources, such as light emitting diodes, etc. may be used for this purpose instead of lasers.

Moreover, the various system components can be arranged relative to each other in a wide variety of ways. Various different optical elements (e.g., lenses, mirrors, etc.) can be incorporated into the system in a variety of ways. The sizes and shapes of the various optical elements can vary as well. The laser(s) can be configured to produce any wavelength or wavelengths of light. The optical identifier, including its optical substrate and/or volume hologram, can vary considerably. For example, the size (length, width, thickness, etc.) of the optical substrate can vary. Likewise, the shape of the optical substrate can vary as well. The distribution and arrangement of data throughout or on the optical substrate can vary as well. The holding apparatus for the optical identifier can vary in size, shape and configuration. The machine code referred to herein can take on any one or more of a variety of possible forms of computer-readable instructions. A variety of specific physical configurations, such as circuit boards having solder points, micro USB connectors, mirrors, housings, holding apparatuses, etc. have been disclosed. The systems and techniques disclosed herein can be implemented however without necessarily incorporating any of the specific physical configurations disclosed herein. Moreover, some implementations might combine features from any of the specific physical configurations disclosed herein, and/or combine those any of those features with other features not specifically disclosed.

As another example, in certain implementations, the systems and techniques disclosed herein can be combined with any other systems or techniques not specifically disclosed herein.

Additionally, in various embodiments, at least some of the subject matter disclosed herein can be implemented in digital electronic circuitry, or in computer-based software, firmware, or hardware, including the structures disclosed in this specification and/or their structural equivalents, and/or in combinations thereof. In some embodiments, the subject matter disclosed herein can be implemented in one or more computer programs, that is, one or more modules of computer program instructions, encoded on computer storage medium for execution by, or to control the operation of, one or more data processing apparatuses (e.g., processors). Alternatively, or additionally, the program instructions can be encoded on an artificially generated propagated signal, for example, a machine-generated electrical, optical, or electromagnetic signal that is generated to encode information for transmission to suitable receiver apparatus for execution by a data processing apparatus. A computer-based memory or computer storage medium can be, or can be included within, a computer-readable storage device, a computer-readable storage substrate, a random or serial access memory array or device, or a combination thereof. While a computer storage medium should not be considered to include a propagated signal, a computer storage medium may be a source or destination of computer program instructions encoded in an artificially generated propagated signal. The computer storage medium can also be, or be included in, one or more separate physical components or media, for example, multiple CDs, computer disks, and/or other storage devices.

The operations described in this specification can be implemented as operations performed by a data processing apparatus (e.g., a processor) on data stored on one or more computer-readable storage devices or received from other sources. The terms "processor," and/or "computer-based processor" encompass all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

Similarly, while operations may be depicted in the drawings and/or described herein as occurring in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The phrases computer-based memory, computer-readable medium, computer-readable storage medium, or the like, is intended to include, for example, non-transitory mediums.

Other implementations are within the scope of the following claims.

What is claimed is:

1. A system comprising:
   a plurality of optical identifiers, each optical identifier comprising:
      an optical substrate; and
      a volume hologram in the optical substrate; and
   a reader for the optical identifiers, the reader comprising:
      an illumination source; and
      a camera,
   wherein the illumination source is configured to direct light into a selected one of the optical identifiers to produce an image of a corresponding one of the volume holograms at the camera, and
   wherein the camera is configured to capture the image, wherein the captured image is stored in a digital format by the system,
   wherein the optical identifier is multiplexed, and thus contains more than one code page, wherein each of the code pages is used for a different purpose.

2. The system of claim 1, wherein the reader further comprises:
   a switch coupled to the illumination source and to the camera,
   wherein the switch is switchable to turn the illumination source on and off and to cause the camera to capture the image.

3. The system of claim 2, wherein the reader further comprises:
   a computer-based processor, and
   wherein the switch is a relay switch coupled to the computer-based processor,
   wherein the processor is configured to cause the relay switch to turn on, thereby delivering power to the illumination source, and
   wherein the processor is configured to cause the camera to capture the image.

4. The system of claim 3, further comprising:
   non-transitory computer-based memory coupled to the processor,
   wherein the processor is configured to store the captured image, or some electronic representation of the captured image, in the non-transitory computer-based memory.

5. The system of claim 3, wherein, after the image is captured, the processor causes or allows the illumination source to turn off.

6. The system of claim 1, further comprising:
   a holder for the optical identifier,
   wherein the holder is positioned relative to the illumination source and the camera in such a manner that light produced by the illumination source will impinge upon the selected one of the optical identifiers that is in the holder and afterwards reach a lens of the camera.

7. The system of claim 6, wherein the holder is a channel or a tray with a flat bottom and two sides that extend orthogonally in an upward direction from opposite sides of the flat bottom.

8. The system of claim 1, wherein
   the reader further comprises:

a circuit board;
solder points on the circuit board;
power and ground leads connected to the solder points; and
one or more communication leads connected to the solder points, or the reader further comprises:
a communication bus that comprises a clock lead and a data lead; and
power and ground leads connected to a micro USB Jack Port Socket Connector,
wherein the clock lead and the data lead are connected to solder points; or the reader further comprises:
a housing; and
a system on board fabrication, or the reader further comprises:
one or more mirrors configured to direct light from the illumination source to the optical identifier and/or from the optical identifier toward a lens of the camera, or the reader further comprises:
one or more mirrors configured to direct light from the illumination source to the optical identifier and/or from the optical identifier toward a lens of the camera,
wherein one or more of the mirrors is placed within a retractable mirror housing, or the reader, or the optical identifier, further comprises:
a reflective surface at a side of the optical identifier opposite the side of the optical identifier where light from the illumination source enters the optical identifier.

9. The system of claim 1, wherein the volume hologram in the optical substrate includes a code page of data.

10. The system of claim 1, wherein the volume hologram in the optical substrate includes more than one code page of data, and
wherein the reader is configured with more than one illumination source to illuminate the more than one code pages.

11. The system of claim 1, wherein each of the plurality of optical identifiers has a different volume hologram than the others.

12. The system of claim 1, wherein the illumination source is a laser.

13. The system of claim 1, wherein the illumination source is a light emitting diode.

14. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
a circuit board;
solder points on the circuit board;
power and ground leads connected to the solder points; and
one or more communication leads connected to the solder points.

15. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
a communication bus that comprises a clock lead and a data lead; and
power and ground leads connected to a micro USB Jack Port Socket Connector, and
wherein the clock lead and the data lead are connected to solder points.

16. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
a housing; and
a system on board fabrication.

17. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
one or more mirrors configured to direct light from the illumination source to the optical identifier and/or from the optical identifier toward a lens of the camera.

18. A system comprising:
a plurality of optical identifiers, each optical identifier comprising:

an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
one or more mirrors configured to direct light from the illumination source to the optical identifier and/or from the optical identifier toward a lens of the camera,
wherein one or more of the mirrors is placed within a retractable mirror housing.

19. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the reader further comprises:
a reflective surface at a side of the optical identifier opposite the side of the optical identifier where light from the illumination source enters the optical identifier.

20. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the optical identifier further comprises:
a reflective surface at a side of the optical identifier opposite the side of the optical identifier where light from the illumination source enters the optical identifier.

21. The system of claim 1, wherein the reader is configured to project different ones of the more than one code page onto the camera as the identifier moves through angles.

22. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein one or more of units of digital data in a code page of digital data in the volume hologram optical identifier is recognizable by an external element as an identifier.

23. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein the external element is an optical identification system (OIS) or a software-based artificial intelligence agent connected to an OIS.

24. A system comprising:
a plurality of optical identifiers, each optical identifier comprising:
an optical substrate; and
a volume hologram in the optical substrate; and
a reader for the optical identifiers, the reader comprising:
an illumination source; and
a camera,
wherein the illumination source is configured to direct light into a selected one of the optical identifiers to produce an image of a corresponding one of the volume holograms at the camera,
wherein the camera is configured to capture the image, wherein the captured image is stored in a digital format by the system, and
wherein each respective one of some of the volume holograms stores a unique identifier for a particular software-based artificial intelligence agent associated with a particular human user, wherein the unique identifier is recognizable by other software-based artificial intelligence agents on a network.

25. The system of claim 24, wherein each respective one of the other volume holograms stores a unique identifier for a person, wherein the unique identifier for the person is recognizable by other software-based artificial intelligence agents on a network.

26. The system of claim 1, wherein the reader further comprises:
a computer-based processor, wherein the processor is configured to cause the camera to capture the image; and
non-transitory computer-based memory coupled to the processor, wherein the computer-based processor is further configured to store the captured image in the non-transitory computer-based memory.

27. The system of claim 26, wherein, after the image is captured, the processor causes an illumination source to turn off.

* * * * *